(12) United States Patent
Kim

(10) Patent No.: US 11,717,932 B2
(45) Date of Patent: *Aug. 8, 2023

(54) POLYURETHANE POLISHING PAD AND COMPOSITION FOR MANUFACTURING THE SAME

(71) Applicant: XIA TAI XIN SEMICONDUCTOR (QING DAO) LTD., Qingdao (CN)

(72) Inventor: Kwang-Bok Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 674 days.

This patent is subject to a terminal disclaimer.

(21) Appl. No.: 16/668,383

(22) Filed: Oct. 30, 2019

(65) Prior Publication Data

US 2020/0215662 A1    Jul. 9, 2020

Related U.S. Application Data

(60) Provisional application No. 62/779,493, filed on Dec. 14, 2018.

(51) Int. Cl.

| | | |
|---|---|---|
| *B24B 37/10* | (2012.01) | |
| *B24B 37/24* | (2012.01) | |
| *B24B 37/32* | (2012.01) | |
| *C08G 18/38* | (2006.01) | |
| *C08G 18/48* | (2006.01) | |
| *C08G 18/66* | (2006.01) | |
| *C08G 18/76* | (2006.01) | |
| *C08K 3/013* | (2018.01) | |
| *C08K 3/04* | (2006.01) | |
| *C08K 3/22* | (2006.01) | |
| *C08K 5/18* | (2006.01) | |
| *C08L 75/04* | (2006.01) | |
| *H01L 21/321* | (2006.01) | |

(52) U.S. Cl.
CPC ............ *B24B 37/24* (2013.01); *B24B 37/107* (2013.01); *B24B 37/32* (2013.01); *C08G 18/485* (2013.01); *C08G 18/7621* (2013.01); *C08G 18/7664* (2013.01); *C08L 75/04* (2013.01); *H01L 21/3212* (2013.01); *C08K 3/013* (2018.01); *C08K 3/04* (2013.01); *C08K 5/18* (2013.01); *C08K 2003/2227* (2013.01)

(58) Field of Classification Search
CPC ..................................................... B24B 37/24
See application file for complete search history.

(56) References Cited

U.S. PATENT DOCUMENTS

| | | | | |
|---|---|---|---|---|
| 6,769,972 | B1* | 8/2004 | Huang | B24B 53/017 451/60 |
| 8,309,466 | B2* | 11/2012 | Ogawa | B24D 3/32 438/692 |
| 8,697,239 | B2* | 4/2014 | Kulp | C08G 18/4808 428/423.1 |
| 9,458,280 | B2* | 10/2016 | Jang | C08G 18/4825 |
| 10,086,494 | B2* | 10/2018 | Weis | B24B 37/24 |
| 2011/0039966 | A1* | 2/2011 | Goto | C08G 18/6674 521/170 |
| 2013/0078892 | A1* | 3/2013 | Sato | B24D 11/00 51/296 |
| 2018/0148537 | A1* | 5/2018 | Barton | C08G 18/4841 |
| 2018/0230333 | A1* | 8/2018 | Reichardt | C09G 1/02 |
| 2019/0168356 | A1* | 6/2019 | Qian | B24B 37/24 |
| 2020/0198092 | A1* | 6/2020 | Kim | C08G 18/6685 |
| 2020/0215663 | A1* | 7/2020 | Kim | C08L 75/04 |

FOREIGN PATENT DOCUMENTS

| | | | |
|---|---|---|---|
| CN | 101175603 | A | 5/2008 |
| CN | 106661434 | A | 5/2017 |

* cited by examiner

*Primary Examiner* — Melissa A Rioja
(74) *Attorney, Agent, or Firm* — ScienBiziP, P.C.

(57) ABSTRACT

The present disclosure provides a composition for manufacturing a polyurethane polishing pad. The composition includes 15 to 25 wt % of MBCA, 25 to 45 wt % of isocyanates, 15 to 45 wt % of polyols, 5 to 35 wt % of EOPO, and 1 to 5 wt % of additives. The polyurethane polishing pad made from the composition of the present disclosure has a hardness within a range of 40 to 70 shore D, an elongation within a range of 200 to 400%, a density within a range of 0.7 to 0.9 g/cc, a modulus within a range of 25000 to 40000 kg/cm$^2$, and a tensile stress within a range of 120 to 320 kg/cm$^2$.

15 Claims, 3 Drawing Sheets

POLYURETHANE POLISHING PAD AND COMPOSITION FOR MANUFACTURING THE SAME

CROSS-REFERENCE TO RELATED APPLICATIONS

This application claims the benefit of and priority to U.S. Provisional Patent Application No. 62/779,493 filed on Dec. 14, 2018, the contents of which are incorporated by reference herein.

FIELD

The present disclosure generally relates to a polyurethane polishing pad. More specifically, the present disclosure relates to a polyurethane polishing pad that has prolonged pad life and improved removal rate for a polishing process.

BACKGROUND

Chemical mechanical polishing or chemical mechanical planarization (CMP) is accomplished by holding a semiconductor wafer against a rotating polishing surface or rotating the wafer relative to the polishing surface, under controlled conditions of temperature, pressure, and chemical composition. The polishing surface may be a planar polishing pad formed of a soft and porous material, such as a blown polyurethane. During CMP, the polishing surface is wetted with a chemically reactive and abrasive aqueous slurry. The aqueous slurry may be acidic or basic, and typically includes abrasive particles, reactive chemical agents (such as transition metal chelated salts or oxidizers), and adjuvants (such as solvents, buffers, and/or passivating agents). Specifically, chemical etching is performed by the reactive chemical agent in the slurry, whereas mechanical polishing is performed by the abrasive particles in cooperation with the CMP pad.

The hardness of the polishing pad may have different effects on the performance of the polishing process. A soft polishing pad having low wear rate (i.e., prolonged pad life) may have poor removal rate to the surface of the wafer. On the other hand, a hard polishing pad having high removal rate to the surface of the wafer may have high wear rate and a shortened pad life. It is desired to have a polishing pad that has low wear rate and high removal rate to improve the performance of polishing process and also increase pad life.

SUMMARY

In view of above, the present disclosure is directed to a polyurethane polishing pad that has improved removal rate and pad life.

An implementation of the present disclosure is directed to a composition for manufacturing a polyurethane polishing pad. The composition includes 15 to 25 weight percent (wt %) of 4,4'-methylene-bis(2-chloroaniline) (MBCA), 25 to 45 wt % of isocyanates, 15 to 45 wt % of polyols, 5 to 35 wt % of ethylene oxide propylene oxide copolyol (EOPO), and 1 to 5 wt % of additives.

Another implementation of the present disclosure is directed to a polyurethane polishing pad manufactured from a composition. The composition includes 15 to 25 wt % of MBCA, 25 to 45 wt % of isocyanates, 15 to 45 wt % of polyols, 5 to 35 wt % of EOPO, and 1 to 5 wt % of additives. The polyurethane polishing pad made from the composition of the present disclosure has a hardness within a range of 40 to 70 shore D, an elongation within a range of 200 to 400%, a density within a range of 0.7 to 0.9 g/cc, a modulus within a range of 25000 to 40000 kg/cm$^2$, and a tensile stress within a range of 120 to 320 kg/cm$^2$.

Another implementation of the present disclosure is directed to a method of manufacturing a polyurethane polishing pad. The method includes actions S301 to S303. In action S301, a composition for manufacturing the polyurethane polishing pad is provided. The composition includes 15 to 25 wt % of MBCA, 25 to 45 wt % of isocyanates, 15 to 45 wt % of polyols, 5 to 35 wt % of EOPO, and 1 to 5 wt % of additives. In action S302, the composition is casted into an open mold. In action S303, the composition is heated to cure and produce a polyurethane resin foam.

Yet another implementation of the present disclosure is directed to a CMP apparatus for polishing a wafer. The CMP apparatus includes a platen, a retaining ring, and a carrier head. The platen has a polishing pad for polishing the wafer with a slurry. The polishing pad is a polyurethane polishing pad manufactured from a composition including 15 to 25 wt % of MBCA, 25 to 45 wt % of isocyanates, 15 to 45 wt % of polyols, 5 to 35 wt % of EOPO, and 1 to 5 wt % of additives. The polyurethane polishing pad made from the composition of the present disclosure has a hardness within a range of 40 to 70 shore D, an elongation within a range of 200 to 400%, a density within a range of 0.7 to 0.9 g/cc, a modulus within a range of 25000 to 40000 kg/cm$^2$, and a tensile stress within a range of 120 to 320 kg/cm$^2$. The retaining ring is configured to hold the wafer. The carrier head is connected to the retaining ring and configured to rotate the retaining ring.

As described above, the polyurethane polishing pad of the implementations of the present disclosure is manufactured from a composition including ethylene oxide propylene oxide copolyol (EOPO) as prepolymers. The polyurethane polishing pad of the present disclosure has high elongation and high hardness. Therefore, the polyurethane polishing pad has improved removal rate to the polishing process and prolonged pad life.

BRIEF DESCRIPTION OF THE DRAWINGS

Implementations of the present technology will now be described, by way of example only, with reference to the attached figures.

DETAILED DESCRIPTION

Figure 1:
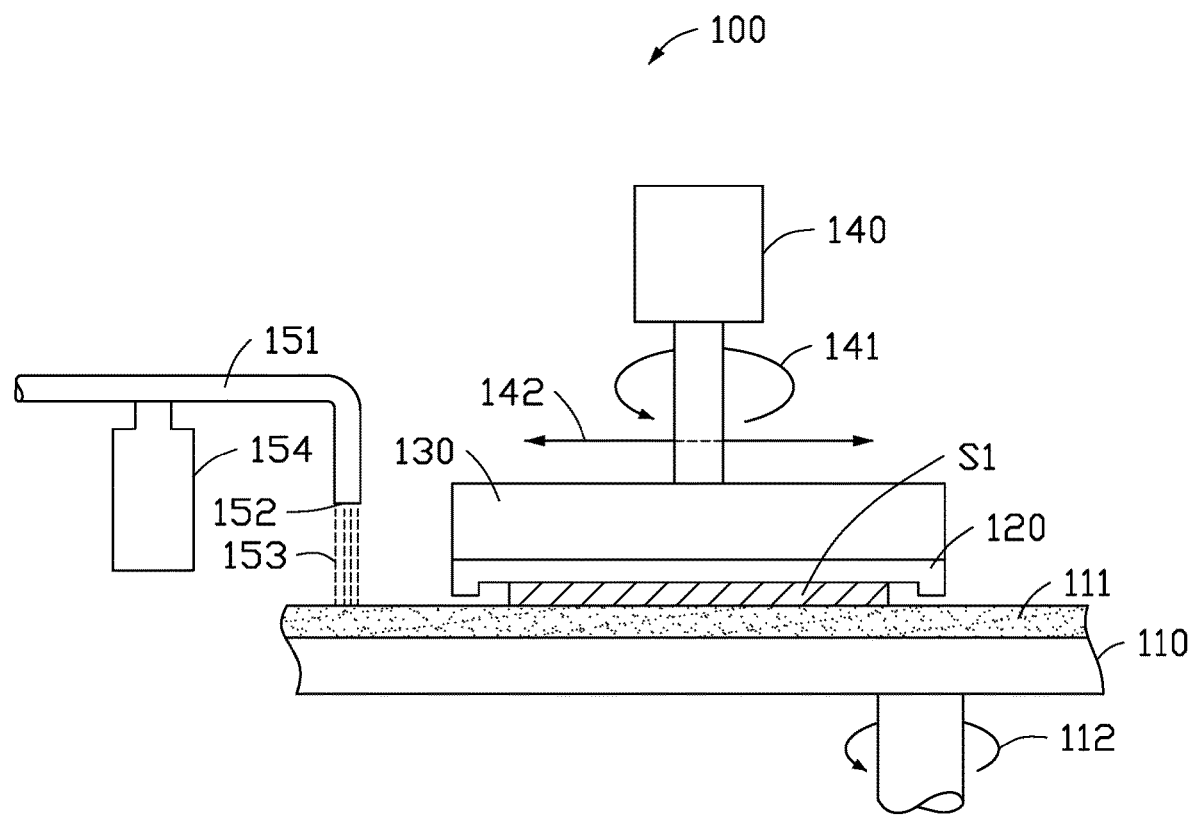
FIG. 1 is a schematic diagram of a CMP apparatus according to an implementation of the present disclosure.

The present disclosure will now be described more fully hereinafter with reference to the accompanying drawings, in which example implementations of the disclosure are shown. This disclosure may, however, be embodied in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations of the present disclosure in conjunction with the accompanying drawings in FIGS. 1 to 3. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Referring to FIG. 1, a schematic diagram of a chemical mechanical polishing (CMP) apparatus is illustrated. The CMP apparatus 100 includes a carrier head 130 and a retaining ring 120. A semiconductor wafer S1 is held in the retaining ring 120. A soft pad (not shown in the figure) is positioned between the retaining ring 120 and the wafer S1, with the wafer S1 being held against the soft pad by a partial vacuum or with an adhesive. The carrier head 130 is provided to be continuously rotated by a drive motor 140, in the direction 141, and additionally may be reciprocated transversely in the directions 142. Accordingly, the combined rotational and transverse movements of the wafer S1 are intended to reduce the variability in the material removal rate across the surface of the wafer S1. The CMP apparatus 100 further includes a platen 110, which is rotated in the direction referenced at 112. A polishing pad 111 is mounted on the platen 110. As compared to the wafer S1, the platen 110 is provided with a relatively large surface area to accommodate the translational movement of the wafer S1 on the retaining ring 120 across the surface of the polishing pad 111. A supply tube 151 is mounted above the platen 110 to deliver a stream of polishing slurry 153, which is dripped onto the surface of the polishing pad 111 from a nozzle 152 of the supply tube 151. The slurry 153 may be gravity fed from a tank or reservoir (not shown), or otherwise pumped through the supply tube 151. Alternatively, the slurry 153 may be supplied from below the platen 110 such that it flows upwardly through the underside of the polishing pad 111. In another implementation, the slurry may be supplied in the retaining ring 120 by nozzles disposed in the retaining ring 120. If the particles in the slurry 153 forms agglomeration of undesirable large particles, the wafer surface would be scratched when the wafer S1 is being polished. Therefore, the slurry 153 need to be filtered to remove the undesirable large particles. Usually, a filter assembly 154 is coupled to the supply tube 151 to separate agglomerated or oversized particles.

The polishing pad 111 is a polyurethane polishing pad. The polyurethane polishing pad of the implementation of the present disclosure is manufactured from a composition that includes a plurality of urethane prepolymers and a curative (or hardener) that cross-links the urethane prepolymers. The urethane prepolymers are formed by reacting polyols (e.g., polyether and/or polyester polyols) with difunctional or polyfunctional isocyanates. The isocyanates used for preparing the urethane prepolymers may be methylene diphenyl diisocyanate (MDI) and/or toluene diisocyanate (TDI). The curative in the composition may be a compound or mixture of compounds used to cross-link, therefore cure or harden, the urethane prepolymers. Specifically, the curative reacts with isocyanates, causing the chains of the urethane prepolymers to link together to form the polyurethane. The curative may include 4,4'-methylene-bis(2-chloroaniline) (MBCA; also referred to by the tradename of MOCA®).

Figure 2A:
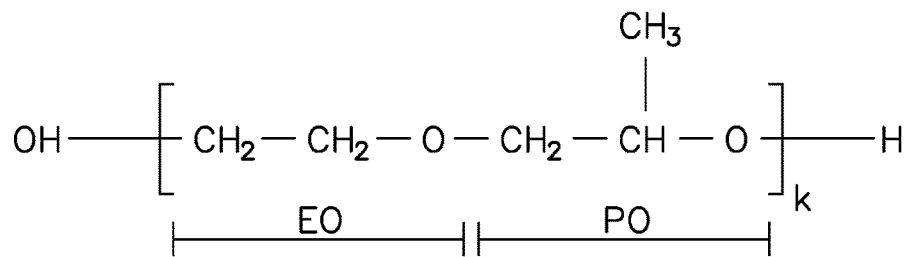
FIGS. 2A to 2D are schematic diagrams showing a chemical structure of an ethylene oxide propylene oxide copolyol (EOPO) according to various implementations of the present disclosure.
Figure 2B:
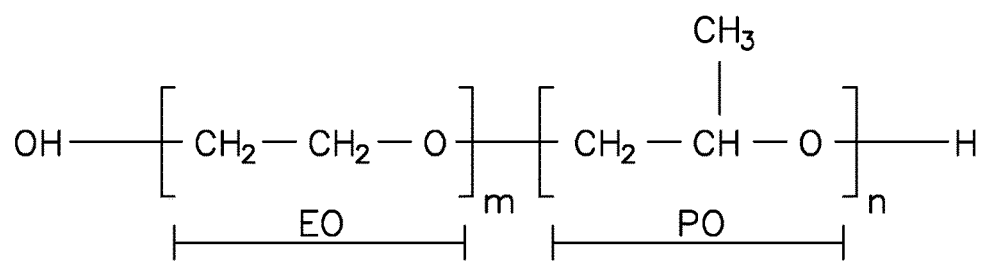
Figure 2C:
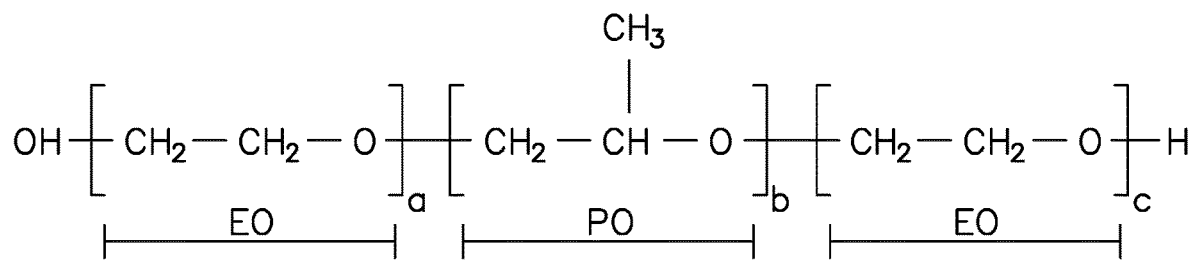
Figure 2D:
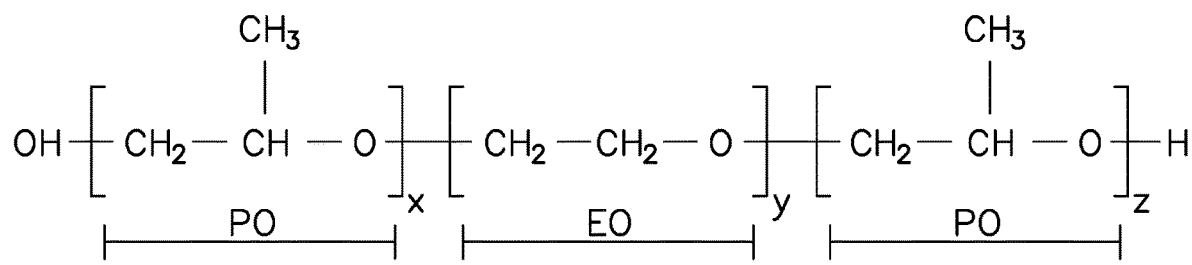

In one implementation, the composition includes 15 to 25 wt % of MBCA, 25 to 45 wt % of isocyanates, 15 to 45 wt % of polyols, and 5 to 35 wt % of ethylene oxide propylene oxide copolyol (EOPO). Preferably, the isocyanates include at least one of TDI and MDI. The polyols are poly(tetramethylene ether)glycol (PTMG). The ethylene oxide propylene oxide copolyol (EOPO) of the implementation of the present disclosure acts as a prepolymer in the composition. EOPO is a copolymer formed by polymerization of ethylene oxide and propylene oxide. Preferably, the composition includes 10 to 25 wt % of EOPO. Referring to FIGS. 2A and 2B, various implementations of chemical structures of EOPO are illustrated. In one implementation as shown in FIG. 2A, the EOPO of the implementation of the present disclosure is an alternative copolyol of ethylene oxide (EO) and propylene oxide (PO) having the chemical structure of OH—$(CH_2$—$CH_2$—O—$CH_2$—$CH(CH_3)$—O$)_k$—H, wherein k is within a range of 5 to 200. In another implementation as shown in FIG. 2B, the EOPO of the implementation of the present disclosure is a block copolyol having the chemical structure of OH—$(CH_2$—$CH_2$—O$)_m$—$(CH_2$—$CH(CH_3)$—O$)_c$—H, wherein m is within a range of 2 to 150 and n is within a range of 2 to 150. In yet another implementation as shown in FIG. 2C, the EOPO of the implementation of the present disclosure is a block copolyol having the chemical structure of OH—$(CH_2$—$CH_2$—O$)_a$—$(CH_2$—$CH(CH_3)$—O$)_b$—$(CH_2$—$CH_2$—O$)_c$—H, wherein a, b, c are within a range of 2 to 80. In still another implementation as shown in FIG. 2D, the EOPO of the implementation of the present disclosure is a block copolyol having the chemical structure of OH—$(CH_2$—$CH(CH_3)$—O$)_x$—$(CH_2$—$CH_2$—O$)_y$—$(CH_2$—$CH(CH_3)$—O$)_z$—H, wherein x, y, z are within a range of 2 to 80.

The composition of the implementations of the present disclosure may further include 1 to 5 wt % of additives. The additives are selected from at least one of a group consisting of surfactants, fillers, catalysts, processing aids, antioxidants, stabilizers, lubricants, and conductive additives. The conductive additives may be selected from at least one of carbon black, carbon fiber, and alumina particles. The conductive additive also may be other conductive nanoparticles such as carbon nanoparticles or carbon nanotubes. The alumina particles may be alumina sphere particles. Preferably, the conductive additive has a conductivity of 1 to 30 mS/cm and a Zeta potential of −200 to 100 mV.

Furthermore, the prepolymers in the composition are often characterized by the weight percentage of unreacted isocyanate groups (NCO %) present in the prepolymer. In one implementation, the composition has a NCO % within the range of 0.1 to 10 wt %, preferably 8.5 to 9.2 wt %.

The polyurethane polishing pad manufactured from the composition of the implementations of the present disclosure has a hardness within a range of 40 to 70 shore D (preferably 50 to 70 shore D), an elongation within a range of 200 to 400% (preferably 250 to 350%), a density within a range of 0.7 to 0.9 g/cc, a modulus within a range of 25000 to 40000 kg/cm$^2$, and a tensile stress within a range of 120 to 320 kg/cm$^2$. The polyurethane polishing pad of the implementations of the present disclosure has high elongation and high hardness. Therefore, the polyurethane polishing pad has improved removal rate to the polishing process and prolonged pad life.

Figure 3:
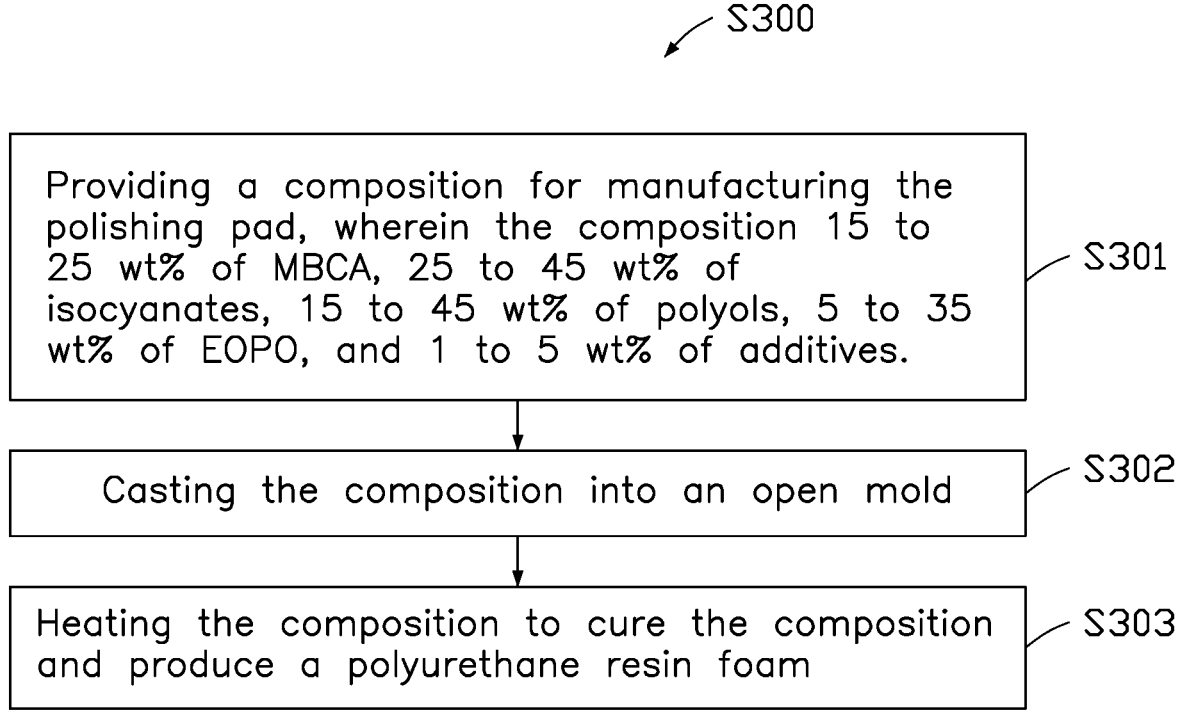
FIG. 3 is a flowchart of a method for manufacturing a polyurethane polishing pad of according to another implementation of the present disclosure.

Referring to FIG. 3, a flowchart of a method of manufacturing a polyurethane polishing pad according to another implementation is illustrated. As shown in FIG. 3, the method S300 includes actions S301, S302, and S303. In action S301, a composition for manufacturing the polyurethane polishing pad is provided. The composition may be referred to the previous implementations. The composition includes 15 to 25 wt % of MBCA, 25 to 45 wt % of isocyanates, 15 to 45 wt % of polyols, 5 to 35 wt % of EOPO, and 1 to 5 wt % of additives. Preferably, the isocyanates include at least one of TDI and MDI. The polyols are poly(tetramethylene ether)glycol (PTMG). In action S302, the composition is casted into an open mold. For example, the open mold is a pan-type open mold. In action S303, the composition is heated to cure and produce a polyurethane resin foam. In one implementation, the composition is heated to 90 to 150 degree Celsius for 5 to 10 hours to cure. The polyurethane resin foam is then sliced into various polishing pads of desirable thickness and shapes. The polyurethane polishing pad manufactured from the composition of the implementations the present disclosure has a hardness within a range of 40 to 70 shore D (preferably 50 to 70 shore D), an elongation within a range of 200 to 400% (preferably 250 to 350%), a density within a range of 0.7 to 0.9 g/cc, a modulus within a range of 25000 to 40000 kg/cm$^2$, and a tensile stress within a range of 120 to 320 kg/cm$^2$. The polyurethane polishing pad of the implementations of the present disclosure has high elongation and high hardness. Therefore, the polyurethane polishing pad has improved removal rate to the polishing process and prolonged pad life.

In yet another implementation, the present disclosure also provides a CMP apparatus for polishing a wafer. The CMP apparatus may be referred to the CMP apparatus 100 of FIG. 1. The CMP apparatus 100 includes a platen 110, a retaining ring 120, a carrier head 130, and a supply tube 151. The platen 110 has a polishing pad 111 for polishing the wafer S1 with a slurry 153. The retaining ring 120 is configured to hold the wafer S1. The carrier head 130 is connected to the retaining ring 120 and configured to rotate the retaining ring 120. The supply tube 151 is configured to provide the slurry 153 to the polishing pad 111 of the platen 110. The CMP apparatus 100 further includes a drive motor 140 connected to the carrier head 130, and a filter assembly 154 connected to the supply tube 151. The drive motor 140 rotates the carrier head 130 in the direction 141, and additionally may be reciprocated transversely in the directions 142. The filter assembly 154 is configured to filter large particles (e.g., agglomerated particles) in the slurry 153 to prevent defects on the surface of the wafer S1.

The polishing pad 111 of the platen 110 is a polyurethane polishing pad manufactured from a composition. The composition includes 15 to 25 wt % of MBCA, 25 to 45 wt % of isocyanates, 15 to 45 wt % of polyols, 5 to 35 wt % of EOPO, and 1 to 5 wt % of additives. Preferably, the isocyanates include at least one of TDI and MDI. The polyols are poly(tetramethylene ether)glycol (PTMG). The polyurethane polishing pad manufactured from the composition of the implementations of the present disclosure has a hardness within a range of 40 to 70 shore D (preferably 50 to 70 shore D), an elongation within a range of 200 to 400% (preferably 250 to 350%), a density within a range of 0.7 to 0.9 g/cc, a modulus within a range of 25000 to 40000 kg/cm$^2$, and a tensile stress within a range of 120 to 320 kg/cm$^2$. The details of the composition and the manufacturing method may be referred to previous implementations without further description herein.

As described above, the polyurethane polishing pad of the implementations of the present disclosure is manufactured from a composition including EOPO as prepolymers. The polyurethane polishing pad of the implementations of the present disclosure has high elongation and high hardness. Therefore, the polyurethane polishing pad has improved removal rate to the polishing process and prolonged pad life.

The implementations shown and described above are only examples. Many details are often found in the art such as the other features of a polyurethane polishing pad and a composition for manufacturing the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. A polyurethane polishing pad manufactured from a composition, the composition comprising:
   15 to 25 weight percent (wt %) of 4,4'-methylene-bis(2-chloroaniline) (MBCA);
   25 to 45 wt % of isocyanates;
   10 to 25 wt % of an ethylene oxide propylene oxide copolyol (EOPO);
   15 to 45 wt % of polyols other than EOPO; and
   1 to 5 wt % of additives.

2. The polyurethane polishing pad of claim 1, wherein the additives of the composition are selected from a group comprising surfactants, fillers, catalysts, processing aids, antioxidants, stabilizers, lubricants, and conductive additives.

3. The polyurethane polishing pad of claim 2, wherein the conductive additives are selected from a group comprising carbon black, carbon fiber, and alumina particles.

4. The polyurethane polishing pad of claim 1, wherein the isocyanates of the composition comprise at least one of toluene diisocyanate (TDI) and methylene diphenyl diisocyanate (MDI).

5. The polyurethane polishing pad of claim 1, wherein the polyols other than EOPO of the composition comprise poly(tetramethylene ether)glycol (PTMG).

6. The polyurethane polishing pad of claim 1, wherein the polyurethane polishing pad has a hardness within a range of 40 to 70 Shore D.

7. The polyurethane polishing pad of claim 1, wherein the polyurethane polishing pad has an elongation within a range of 200 to 400%.

8. The polyurethane polishing pad of claim 1, wherein the polyurethane polishing pad has a density within a range of 0.7 to 0.9 g/cc.

9. The polyurethane polishing pad of claim 1, wherein the polyurethane polishing pad has a modulus within a range of 25000 to 40000 kg/cm$^2$.

10. The polyurethane polishing pad of claim 1, wherein the polyurethane polishing pad has a tensile stress within a range of 120 to 320 kg/cm$^2$.

11. A method of manufacturing a polyurethane polishing pad, comprising:
    providing a composition for manufacturing the polishing pad, wherein the composition comprises:
        15 to 25 wt % of 4,4'-methylene-bis(2-chloroaniline);
        25 to 45 wt % of isocyanates;
        10 to 25 wt % of an ethylene oxide propylene oxide copolyol (EOPO);
        15 to 45 wt % of polyols other than EOPO; and
        1 to 5 wt % of additives;
    casting the composition into an open mold; and
    heating the composition to cure the composition and produce a polyurethane resin foam.

12. The method of claim 11, wherein the polyurethane polishing pad has a hardness within a range of 40 to 70 shore D, an elongation within a range of 200 to 400%, a density within a range of 0.7 to 0.9 g/cc, a modulus within a range of 25000 to 40000 kg/cm$^2$, and a tensile stress within a range of 120 to 320 kg/cm$^2$.

13. A chemical mechanical polishing (CMP) apparatus for polishing a wafer, the CMP apparatus comprising:
    a platen having a polishing pad for polishing the wafer with a slurry, wherein the polishing pad is a polyurethane polishing pad manufactured from a composition comprising:
        15 to 25 wt % of 4,4'-methylene-bis(2-chloroaniline);
        25 to 45 wt % of isocyanates;
        10 to 25 wt % of an ethylene oxide propylene oxide copolyol (EOPO);
        15 to 45 wt % of polyols other than EOPO; and
        1 to 5 wt % of additives;
    a retaining ring configured to hold the wafer, and
    a carrier head connected to the retaining ring and configured to rotate the retaining ring.

14. The CMP apparatus of claim 13, further comprising a supply tube configured to supply the slurry to the polishing pad.

15. The CMP apparatus of claim 13, further comprising a drive motor connected to the carrier head and configured to rotate the carrier head.

* * * * *